(12) United States Patent
Shi

(10) Patent No.: US 10,761,652 B2
(45) Date of Patent: Sep. 1, 2020

(54) TOUCH PANEL, TOUCH DEVICE AND METHOD OF MANUFACTURING TOUCH PANEL

(71) Applicant: BOE TECHNOLOGY GROUP CO., LTD., Beijing (CN)

(72) Inventor: Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/336,194

(22) PCT Filed: Sep. 14, 2018

(86) PCT No.: PCT/CN2018/105746
§ 371 (c)(1),
(2) Date: Mar. 25, 2019

(87) PCT Pub. No.: WO2019/105102
PCT Pub. Date: Jun. 6, 2019

(65) Prior Publication Data
US 2019/0346987 A1 Nov. 14, 2019

(30) Foreign Application Priority Data
Dec. 1, 2017 (CN) .......................... 2017 1 1250373

(51) Int. Cl.
*G06F 3/041* (2006.01)
*G06F 3/044* (2006.01)
(Continued)

(52) U.S. Cl.
CPC ........ *G06F 3/04166* (2019.05); *G06F 3/0412* (2013.01); *G06F 3/0445* (2019.05);
(Continued)

(58) Field of Classification Search
CPC ....................................................... G09G 3/30
See application file for complete search history.

(56) References Cited

U.S. PATENT DOCUMENTS

2009/0315858 A1  12/2009  Sato et al.
2013/0335365 A1* 12/2013  Kim ........................ G06F 3/044
                                                      345/174
(Continued)

FOREIGN PATENT DOCUMENTS

CN        203759677 U      8/2014
CN        105528118 A      4/2016
(Continued)

OTHER PUBLICATIONS

International Search Report of PCT/CN2018/105746 in Chinese, dated Dec. 19, 2018, with English translation.
(Continued)

*Primary Examiner* — Roy P Rabindranath
(74) *Attorney, Agent, or Firm* — Collard & Roe, P.C.

(57) ABSTRACT

A touch panel, a touch device with the touch panel and a method of manufacturing the touch panel are provided. The touch panel includes a base substrate, a touch structure and a touch shift register circuit. The touch structure includes: touch scanning electrodes, arranged on the base substrate along a first direction; and touch sensing electrodes, arranged on the base substrate along a second direction, the first direction intersecting with the second direction. The touch shift register circuit is arranged on the base substrate, electrically connected to the touch scanning electrodes and configured to provide touch scanning signals to the touch scanning electrodes.

16 Claims, 9 Drawing Sheets

(51) Int. Cl.
  *H01L 27/12* (2006.01)
  *H01L 27/32* (2006.01)
  *H01L 51/52* (2006.01)

(52) U.S. Cl.
  CPC ........ *G06F 3/0446* (2019.05); *G06F 3/04164* (2019.05); *H01L 27/124* (2013.01); *H01L 27/1259* (2013.01); *H01L 27/323* (2013.01); *H01L 51/524* (2013.01); *H01L 51/5253* (2013.01); *G06F 2203/04103* (2013.01); *G06F 2203/04111* (2013.01)

(56) References Cited

U.S. PATENT DOCUMENTS

| | | | | |
|---|---|---|---|---|
| 2015/0084920 | A1* | 3/2015 | Abe | G06F 3/044 345/174 |
| 2015/0348486 | A1 | 12/2015 | Suzuki et al. | |
| 2016/0299594 | A1* | 10/2016 | Zhang | G06F 3/041 |
| 2017/0177158 | A1 | 6/2017 | Tu et al. | |
| 2017/0186773 | A1* | 6/2017 | Fan | G06F 3/044 |
| 2017/0221441 | A1* | 8/2017 | Gu | G06F 3/0412 |
| 2017/0235408 | A1 | 8/2017 | Yang et al. | |
| 2017/0256593 | A1* | 9/2017 | Jung | H01L 27/3246 |
| 2019/0012022 | A1* | 1/2019 | Ye | H01L 27/323 |

FOREIGN PATENT DOCUMENTS

| | | |
|---|---|---|
| CN | 106484187 A | 3/2017 |
| CN | 106855760 A | 6/2017 |
| KR | 20150078764 A | 7/2015 |

OTHER PUBLICATIONS

Notice of Transmittal of the International Search Report of PCT/CN2018/105746 in Chinese, dated Dec. 19, 2018.

Written Opinion of the International Searching Authority of PCT/CN2018/105746 in Chinese, dated Dec. 19, 2018 with English translation.

Chinese Office Action in Chinese Application No. 201711250373.4, dated Dec. 4, 2019 with English translation.

* cited by examiner

TOUCH PANEL, TOUCH DEVICE AND METHOD OF MANUFACTURING TOUCH PANEL

CROSS REFERENCE TO RELATED APPLICATIONS

This application is the National Stage of PCT/CN2018/105746 filed on Sep. 14, 2018, which claims priority under 35 U.S.C. § 119 of Chinese Application No. 201711250373.4 filed on Dec. 1, 2017, the disclosure of which is incorporated by reference.

TECHNICAL FIELD

Embodiments of the present disclosure relate to a touch panel, a touch device with the touch panel and a method of manufacturing the touch panel.

BACKGROUND

With development of technologies, touch screens are more and more widely applied. Touch screens utilize a haptic feedback system to replace a mechanical button panel so as to provide a simple and convenient human-computer interaction mode. According to different working principles, touch screens include a capacitive type, a resistive type, an infrared type, a surface acoustic wave type and the like. The capacitive touch screen works by utilizing a current sensing phenomenon of a human body, supports multipoint touch and has advantages of wear resistance, long service life, low power consumption and the like, and thus is rapidly developed and has been widely applied to electronic products such as a mobile phone, a tablet personal computer, a notebook computer, a television, a display, a digital photo frame, a navigator and the like.

SUMMARY

At least one embodiment of the present disclosure provides a touch panel. The touch panel comprises: a base substrate; a touch structure, the touch structure comprising: touch scanning electrodes, arranged on the base substrate along a first direction; and touch sensing electrodes, arranged on the base substrate along a second direction, wherein the first direction intersects with the second direction; and a touch shift register circuit, arranged on the base substrate, electrically connected to the touch scanning electrodes and configured to provide touch scanning signals to the touch scanning electrodes.

For example, in the touch panel provided by an embodiment of the present disclosure, each of the touch scanning electrodes comprises a plurality of first electrode portions and a plurality of second electrode portions, the first electrode portions and the touch sensing electrodes are in a same layer, and the second electrode portions are in a different layer and serve as bridging portions for connecting adjacent first electrode portions, so that the touch scanning electrodes pass over the touch sensing electrodes intersecting with the touch scanning electrodes.

For example, in the touch panel provided by an embodiment of the present disclosure, the touch shift register circuit comprises at least one thin film transistor, a source electrode and a drain electrode of the thin film transistor are in a same layer as the first electrode portions of the touch scanning electrodes, and a gate electrode of the thin film transistor is in a same layer as the second electrode portions of the touch scanning electrodes.

For example, in the touch panel provided by an embodiment of the present disclosure, the first electrode portions are farther away from the base substrate than the second electrode portions.

For example, the touch panel provided by an embodiment of the present disclosure further comprises a display structure, and the display structure and the touch structure are laminated in a direction perpendicular to a panel surface of the touch panel.

For example, in the touch panel provided by an embodiment of the present disclosure, the display structure and the touch structure are on a same side of the base substrate, and the touch structure is farther away from the base substrate than the display structure.

For example, the touch panel provided by an embodiment of the present disclosure further comprises a thin film packaging layer, the thin film packaging layer is on the display structure, and the touch structure is on the thin film packaging layer.

For example, in the touch panel provided by an embodiment of the present disclosure, the touch shift register circuit is on the thin film packaging layer.

For example, in the touch panel provided by an embodiment of the present disclosure, the display structure comprises an array substrate, the array substrate serves as the base substrate, and the touch shift register circuit is on the array substrate.

For example, in the touch panel provided by an embodiment of the present disclosure, the thin film packaging layer comprises via holes, and the touch shift register circuit is covered by the thin film packaging layer and is electrically connected to the touch scanning electrodes through the via holes in the thin film packaging layer.

For example, in the touch panel provided by an embodiment of the present disclosure, the display structure further comprises a display shift register circuit, and the touch shift register circuit and the display shift register circuit are arranged side by side on the array substrate.

For example, in the touch panel provided by an embodiment of the present disclosure, the display structure further comprises a common electrode line, and the common electrode line is on the array substrate.

For example, the touch panel provided by an embodiment of the present disclosure further comprises a first shift register circuit, the display structure further comprises a display shift register circuit, the first shift register circuit comprises the touch shift register circuit and the display shift register circuit, touch scanning connecting lines are on the array substrate, the thin film packaging layer comprises via holes, and the touch shift register circuit is electrically connected to the touch scanning electrodes through the touch scanning connecting lines and the via holes in the thin film packaging layer.

For example, in the touch panel provided by an embodiment of the present disclosure, the display structure comprises a cover board, the cover board serves as the base substrate, and the display structure and the touch structure are on different sides of the cover board.

For example, in the touch panel provided by an embodiment of the present disclosure, the display structure comprises an electroluminescent display array.

At least one embodiment of the present disclosure further provides a touch device, comprising the touch panel provided by any one of the embodiments described above.

At least one embodiment of the present disclosure further provides a method of manufacturing a touch panel, comprising: forming a touch shift register circuit and a touch structure on a base substrate. The touch structure comprises touch scanning electrodes and touch sensing electrodes, the touch scanning electrodes are arranged on the base substrate along a first direction, the touch sensing electrodes are arranged on the base substrate along a second direction, the first direction intersects with the second direction, and the touch shift register circuit is electrically connected to the touch scanning electrodes.

BRIEF DESCRIPTION OF THE DRAWINGS

In order to clearly illustrate the technical solution of the embodiments of the disclosure, the drawings of the embodiments will be briefly described in the following; and it is obvious that the described drawings are only related to some embodiments of the disclosure and thus are not limitative of the disclosure.

DETAILED DESCRIPTION

Figure 1:
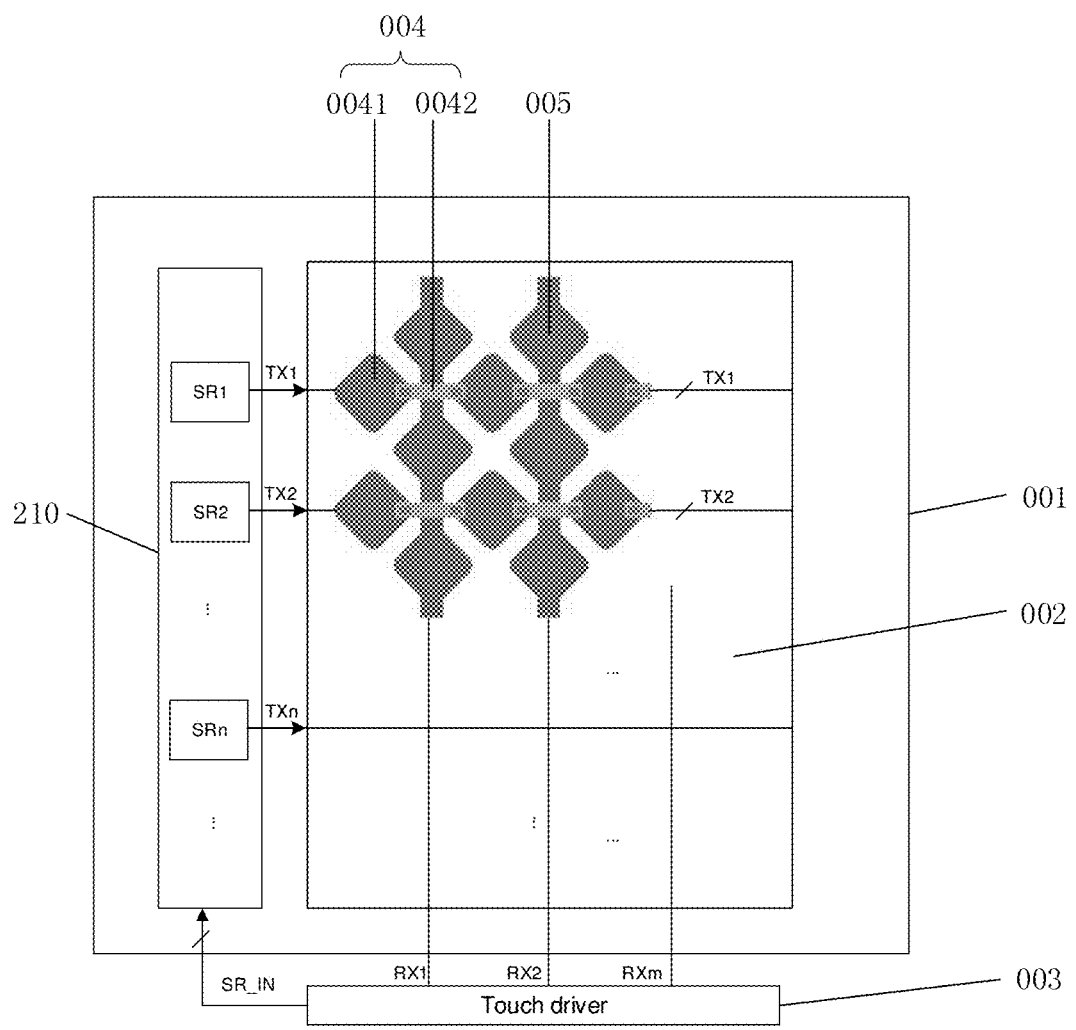
FIG. 1 is a schematic plan view of a touch panel provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments of the disclosure herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the present disclosure, words such as "first", "second" and the like do not denote any order, quantity, or importance, but rather are used for distinguishing different components. Similarly, words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position of a described object is changed, the relative positional relationship may also be correspondingly changed.

Capacitive touch screens include self-capacitive touch screens and mutual capacitive touch screens. A mutual capacitive touch screen generally includes two groups of electrodes which respectively are touch scanning electrodes and touch sensing electrodes. The two groups of electrodes are arranged in an intersecting mode on a base substrate, and capacitors are formed at intersections of the two groups of electrodes. When a finger touches the screen, coupling of the capacitor formed between a touch scanning electrode and a touch sensing electrode by intersection near a touch point is influenced so as to change capacitance of the capacitor between the electrodes. A touch driver provides scanning signals to the touch scanning electrodes by a touch shift register circuit therein and then detects variations of capacitance values by detecting sensing signals received by the touch sensing electrodes so as to determine a touch position. Due to the large number of the touch scanning electrodes, there are many lead wires between the touch driver and a touch panel; the lead wires are interfered by a side signal, so that loads are increased; different lengths of the lead wires cause different loads, which thus interferes the detection signal and influences detection accuracy; and such setting proposes high requirements for drive signals.

At least one embodiment of the present disclosure provides a touch panel, a touch device with the touch panel and a method of manufacturing the touch panel. In the touch panel, by producing a touch shift register circuit on a base substrate on which a touch structure is arranged, lengths of lead wires between the touch shift register and the touch scanning electrodes are shortened and the number of the lead wires between the touch driver and the touch panel is reduced, which thus can solve problems of load increase caused by interference of the side signal to the lead wires and different loads caused by different lengths of lead wires, improve detection accuracy, and lowers the requirement for the drive signals. Moreover, the touch panel provided by at least one embodiment can further attenuate influence on frame design and is beneficial for implementing touch and display driving integration and narrow frame design.

Hereinafter, the embodiments of the present disclosure will be illustrated in detail with reference to the drawings. It should be noted that the same reference signs in different drawings will be used for denoting the same components described.

At least one embodiment of the present disclosure provides a touch panel. The touch panel includes a base substrate, a touch structure and a touch shift register circuit. The touch structure includes touch scanning electrodes and touch sensing electrodes, the touch scanning electrodes are arranged on the base substrate along a first direction, the touch sensing electrodes are arranged on the base substrate along a second direction, and the first direction intersects with the second direction. The touch shift register circuit is arranged on the base substrate, electrically connected to the touch scanning electrodes, and configured to provide touch scanning signals to the touch scanning electrodes.

FIG. 1 is a schematic plan view of a touch panel provided by an embodiment of the present disclosure. With reference to FIG. 1, a touch panel 001 includes touch scanning electrodes 004, touch sensing electrodes 005 and a touch shift register circuit 210 which are arranged on a base substrate.

The touch scanning electrodes 004 and the touch sensing electrodes 005 are insulated from each other and arranged in a touch active region 002. The touch scanning electrodes 004 are arranged along a first direction (a transverse direction in the drawing), the touch sensing electrodes 005 are arranged along a second direction (a longitudinal direction in the drawing) intersecting with the first direction. For example, the first direction and the second direction are perpendicular to each other, i.e., an included angle between the first direction and the second direction is 90 degrees, and the embodiments of the present disclosure are not limited thereto.

For example, in an example as shown in FIG. 1, each of the touch scanning electrodes 004 includes a plurality of first electrode portions 0041 and a plurality of second electrode portions 0042, and the touch sensing electrodes 005 continuously extend. The first electrode portions 0041 and the touch sensing electrodes 005 are in a same layer. The second electrode portions 0042 are in a different layer (may be in a layer closer to the base substrate or a layer farther away from the base substrate) and serve as bridging portions for connecting adjacent first electrode portions 0041, so that the touch scanning electrodes 004 pass over the touch sensing electrodes 005 intersecting therewith. It should be noted that in each embodiment of the present disclosure, the touch scanning electrodes 004 and the touch sensing electrodes 005 are not limited to a diamond-shaped block structure as shown in the drawing, and may be in other structural forms, such as a rectangle, a triangle, a circle and the like. For example, in an example of an embodiment, the touch sensing electrodes 005 and the touch scanning electrodes 004 are in different layers so as to implement mutual intersection and insulation, and thus, the bridging portions are not needed, and in this way, the production process is simple and it is easy to implement. For example, in another example of the embodiment, the touch scanning electrodes 004 continuously extend, each of the touch sensing electrodes 005 may include the first electrode portions and the second electrode portions, and the second electrode portions serve as the bridging portions, so that the touch sensing electrodes 005 pass over the touch scanning electrodes 004 intersecting therewith. Herein, the first direction and the second direction may be random directions, and the included angle between the first direction and the second direction is not limited to 90 degrees.

The touch shift register circuit 210 is directly arranged on the base substrate and located in a peripheral region outside the touch active region 002. The touch shift register circuit 210 includes a plurality of cascaded sub-circuits (shift register units) SRn (where, n≥1), and the plurality of sub-circuits SRn and a plurality of touch scanning electrodes 004 arranged in parallel to each other correspond one to one and are electrically connected, respectively, so as to sequentially provide touch scanning signals TXn (where, n≥1) to the plurality of touch scanning electrodes 004 in the working process and for example, provide the touch scanning signals TXn in a progressive scanning mode. A structural form of the touch shift register circuit 210 is not limited, which may be a structural form of including a plurality of thin film transistors (TFTs), field effect transistors or other devices with the same characteristics, or may also be other applicable structural forms. The TFTs may be oxide TFTs, or may also be other types of transistors, such as amorphous silicon thin film transistors, polycrystalline silicon TFTs and the like. An arrangement position of the touch shift register circuit 210 on the touch panel 001 is not limited, and can be determined according to actual demands.

A touch driver 003 may be arranged outside the touch panel 001, and for example, may be electrically connected to the touch shift register circuit 210 and the touch sensing electrodes 005 by a flexible printed circuit board and the like. The touch driver 003 is used for controlling the touch panel 001 to carry out touch detection and for example, provide a shift trigger signal SR_IN to the touch shift register circuit 210 and collect a plurality of sensing signals RXm (where, m≥1) of the touch sensing electrodes 005. The touch driver 003 may further include a processing circuit for determining coordinates of touch positions in the touch active region 002 according to the sensing signals RXm. A structural form of the touch driver 003 is not limited, and may be a dedicated or general-purpose chip, or may be a dedicated driving circuit or a dedicated driving apparatus or other applicable structural forms.

By directly arranging the touch shift register circuit 210 on the touch panel 001, lengths of lead wires between the touch shift register circuit 210 and the touch scanning electrodes 004 can be shortened and the number of the lead wires between the touch driver 003 and the touch panel 001 can be reduced, which thus can solve the problems of load increase caused by interference of the side signal to the lead and different loads caused by different lengths of the lead wires, improve detection accuracy, and lowers the requirement for the drive signals.

The working process of the touch panel 001 is described as follows. When touch detection is carried out, the touch driver 003 arranged outside the touch panel 001 outputs the shift trigger signal SR_IN, the touch shift register circuit 210 starts to, for example, output a plurality of touch scanning signals TXn row by row to the touch scanning electrodes 004 after receiving the shift trigger signal SR_IN, and the touch driver 003 detects a plurality of sensing signals RXm on the touch sensing electrodes 005 so as to determine the coordinates of the touch positions in the touch active region 002 according to the sensing signals RXm.

Figure 2:
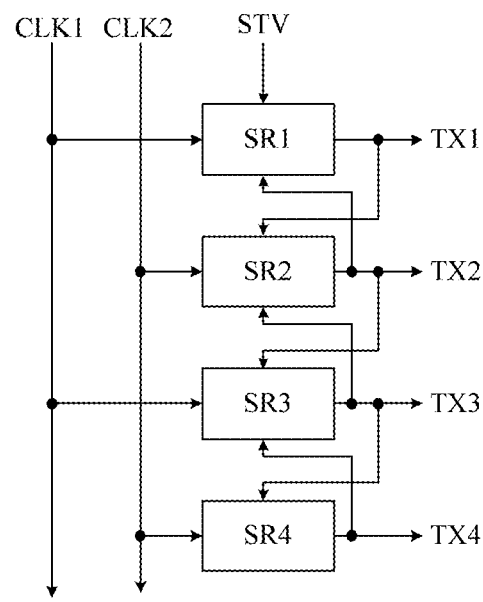
FIG. 2 is a structural schematic diagram of a touch shift register circuit of a touch panel provided by an embodiment of the present disclosure.

In an example of an embodiment, a structure of the touch shift register circuit 210 is as shown in FIG. 2. The touch shift register circuit 210 includes a plurality of cascaded sub-circuits (shift register units) SRn (where, n=1, 2, 3, 4). Certainly, the number of the sub-circuits SRn is not limited to four, and may be a random number and can be determined according to the number of the touch scanning electrodes 004. Input signals include clock signals, a turn-on signal STV (i.e., the shift trigger signal SR_IN), a high-level signal VGH (not shown in the drawing) and a low-level signal VGL (not shown in the drawing). The clock signals may include a first clock signal CLK1 and a second clock signal CLK2 as required for providing clocks for the sub-circuits SRn. According to different structures of the circuit, the number of the clock signals is not limited to two and may be one or more. The high-level signal VGH and the low-level signal VGL are used for providing constant-voltage signals for the touch shift register circuit 210. According to different structures of the circuit, one high-level signal VGH and one low-level signal VGL may be required, a plurality of high-level signals VGH and a plurality of low-level signals VGL may be required, or the high-level signal VGH and/or the low-level signal VGL may not be required, which is not limited in the embodiments of the present disclosure. The turn-on signal STV is input into a first sub-circuit SR1. According to different structures of the circuit, the number of the turn-on signals STV may be one or more. The touch scanning signals TX1, TX2, TX3 and TX4 respectively are scanning signals output to the corresponding touch scanning electrodes 004 by the sub-circuits SR1, SR2, SR3 and SR4. Moreover, except the first sub-circuit SR1 and the last sub-circuit SR4, an output signal TXn of each sub-circuit SRn is also respectively used as a reset signal of the previous sub-circuit and an input signal of the next sub-circuit.

Figure 3:
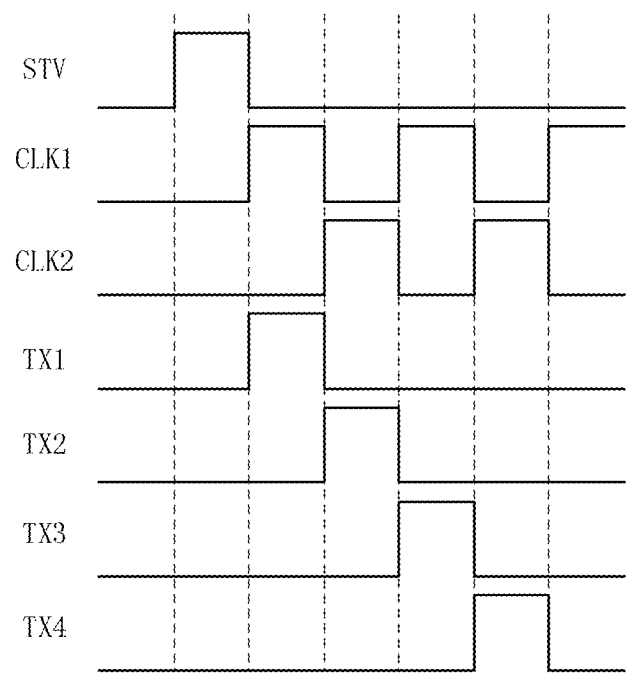
FIG. 3 is a signal timing diagram of a touch shift register circuit of a touch panel provided by an embodiment of the present disclosure.

FIG. 3 is a signal timing diagram of a touch shift register circuit in a touch panel provided by an embodiment of the present disclosure. With reference to FIG. 3, after touch scanning is started, the touch driver 003 inputs the turn-on signal STV, the first clock signal CLK1 and the second clock signal CLK2 to the touch shift register circuit 210. The first sub-circuit SR1 receives the turn-on signal STV, and when the corresponding first clock signal CLK1 is at a high level, outputs a high-level square wave, i.e., the first touch scanning signal TX1. The first touch scanning signal TX1 is used not only for scanning the corresponding touch scanning electrode 004, but also as the input signal for acting on a next sub-circuit SR2. Starting from the second sub-circuit SR2, the subsequent sub-circuit SRn receives the input signal provided by the previous sub-circuit, and when the respective corresponding clock signal is at a high level, outputs the high-level square wave, i.e., the touch scanning signal TXn. The touch scanning signal TXn is used not only for scanning the corresponding touch scanning electrode 004, but also as the input signal for acting on the next sub-circuit, and is also used as the reset signal for acting on the previous sub-circuit. Such operation is carried on until output of the last sub-circuit SR4 is ended. Each sub-circuit SRn closes output of the previous sub-circuit when starting to output, and the next sub-circuit also starts to output and closes output of the sub-circuit SRn after output of the sub-circuit SRn is ended. Therefore, each sub-circuit SRn can implement sequential output, and thus a function of a shift register is achieved. Certainly, the numbers of the input signals and the output signals of the touch shift register circuit 210 are not limited to the numbers described in this embodiment, and may be random numbers and can be determined according to actual demands.

Figure 4:
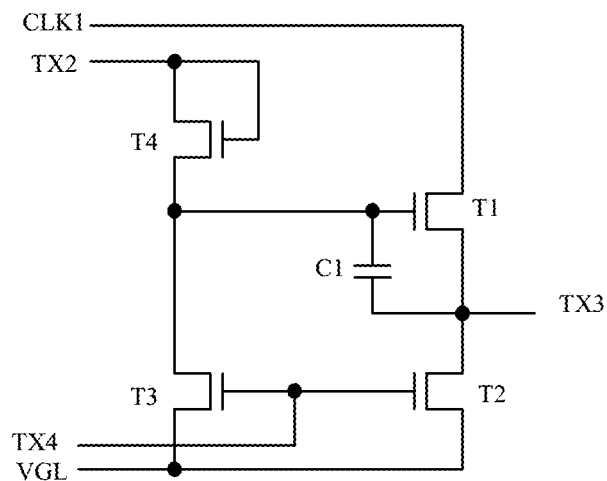
FIG. 4 is a structural diagram of a sub-circuit of a touch shift register circuit of a touch panel provided by an embodiment of the present disclosure.

In an example of an embodiment, a circuit structure of the sub-circuit SR3 is as shown in FIG. 4. With reference to FIG. 4, the sub-circuit SR3 includes a first transistor T1, a second transistor T2, a third transistor T3, a fourth transistor T4 and a capacitor C1. For example, a first electrode of the first transistor T1 is connected to the first clock signal CLK1, and a second electrode of the first transistor T1 is connected to a first electrode of the second transistor T2 and outputs a third driving scanning signal TX3. A gate electrode of the first transistor T1 is connected to a first electrode of the third transistor T3 and a second electrode of the fourth transistor T4. A second electrode of the second transistor T2 is connected to a second electrode of the third transistor T3 and the low-level signal VGL. A gate electrode of the second transistor T2 is connected to a gate electrode of the third transistor T3 and a fourth driving scanning signal TX4. A first electrode of the fourth transistor T4 is connected to a gate electrode of the fourth transistor T4, and is connected to a second driving scanning signal TX2. One end of the capacitor C1 is connected to the gate electrode of the first transistor T1, and the other end of the capacitor C1 is connected to the second electrode of the first transistor T1. In the working process of the circuit, when the second driving scanning signal TX2 is at a high level, the fourth transistor T4 and the first transistor T1 are turned on, and thus, the third driving scanning signal TX3 is equal to the first clock signal CLK1, i.e., when the first clock signal CLK1 is at a high level, the third driving scanning signal TX3 also outputs a high level. When the fourth driving scanning signal TX4 is at a high level, the second driving transistor T2 and the third driving transistor T3 are turned on, and thus, the third driving scanning signal TX3 is equal to the low-level signal VGL, i.e., a resetting effect is achieved. A source electrode and a drain electrode of each transistor are symmetrical, and thus, the source electrode and the drain electrode of each transistor can be exchanged. The first electrode may be the source electrode or the drain electrode, and the second electrode may be the drain electrode or the source electrode. For example, each transistor is an N-type transistor. Certainly, each transistor is not limited to the N-type transistor, and may also be a P-type transistor, as long as the polarity of the corresponding turn-on signal STV is correspondingly changed.

It should be noted that in each embodiment of the present disclosure, the structure of the sub-circuit SR3 is not limited to the structure described above. The sub-circuit SR3 may be of a random structure, and may also include more or less transistors and/or capacitors, and for example, may be added with sub-circuits for achieving functions of pull-up node control, pull-down node control, noise reduction and the like. Similarly, the sub-circuit SRn may be of the structure described above, and may also be of a random applicable structure, which is not limited in the embodiments of the present disclosure.

Figure 5:
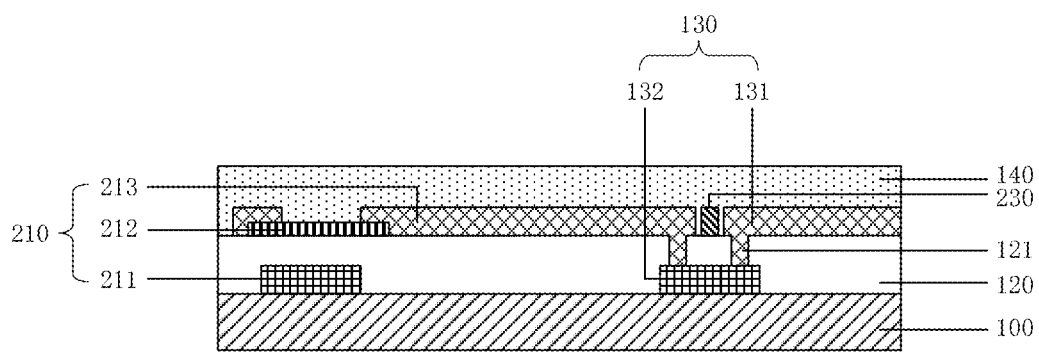
FIG. 5 is a sectional schematic diagram of a touch panel provided by an embodiment of the present disclosure.

FIG. 5 is a sectional schematic diagram of a touch panel provided by an embodiment of the present disclosure. With reference to FIG. 5, the touch panel includes a base substrate 100, a gate insulating layer 120, a touch shift register circuit 210, a touch scanning electrode 130, a touch sensing electrode 230 and a protective layer 140.

For example, the touch shift register circuit 210 includes a plurality of TFTs, capacitors and the like. At least one TFT includes a gate electrode 211, an active layer 212 and a source electrode/drain electrode 213. The gate electrode 211 is arranged on the base substrate 100, and is covered by the gate insulating layer 120. The active layer 212 is arranged on the gate insulating layer 120 to form a channel region. The source electrode/drain electrode 213 is arranged on the gate insulating layer 120, and as shown in FIG. 5, directly overlaps both ends of the active layer 212; or, in a case that the active layer 212 is covered with an interlayer insulating layer, the source electrode/drain electrode 213 may also be respectively in electrical contact with the active layer 212 through two via holes. Herein, the gate electrode 211, the active layer 212 and the source electrode/drain electrode 213 constitute a bottom-gate type TFT. Certainly, the embodiments of the present disclosure are not limited thereto, and the touch shift register circuit 210 may include the bottom-gate type TFT, and may also include a top-gate type TFT, or simultaneously includes the bottom-gate type TFT and the top-gate type TFT. Herein, the base substrate 100 may be a glass substrate, a plastic substrate and the like; and moreover, an inorganic buffer layer can be firstly formed on the base substrate 100 and then the above-mentioned circuit construction can be formed on the inorganic buffer layer. The gate electrode 211 and the source electrode/drain electrode 213 may adopt a metal, a transparent conductive material or other applicable materials. The active layer 212 may adopt amorphous silicon, polycrystalline silicon, a metal oxide or other applicable materials. The gate insulating layer 120 may adopt a silicon nitride or other applicable materials.

In this example, the touch scanning electrode 130 includes a first electrode portion 131 and a second electrode portion 132. The first electrode portion 131 is arranged on the gate insulating layer 120, and the first electrode portion 131 which is closest to the source electrode/drain electrode 213 is electrically connected to the source electrode/drain electrode 213, so that a touch scanning signal TXn output by the touch shift register circuit 210 can be received. The second electrode portion 132 is arranged on the base substrate 100. The gate insulating layer 120 comprises a first via hole 121. The first electrode portion 131 is electrically connected to the second electrode portion 132 through the first via hole 121, and the second electrode portion 132 serves as a bridging portion so as to connect two adjacent first electrode portions 131. Herein, the first electrode portion 131 and the source electrode/drain electrode 213 (i.e., the source electrode and the drain electrode) are in the same layer, and the second electrode portion 132 and the gate electrode 211 are in the same layer; and thus, when the touch shift register circuit 210 is manufactured, the touch scanning electrode 130 can be manufactured simultaneously, so as to simplify the process and reduce cost. Structural forms of the first electrode portion 131 and the second electrode portion 132 are not limited, the first electrode portion 131 may also be arranged on the base substrate 100, and the second electrode portion 132 may also be arranged on the gate insulating layer 120, or other applicable structural forms are adopted. The first electrode portion 131 and the second electrode portion 132 may adopt a metal, a transparent conductive material or other applicable materials.

In this example, the touch sensing electrode 230 is arranged on the gate insulating layer 120, and is in the same layer as the first electrode portion 131 and intersects with the first electrode portion 131. An arrangement position of the touch sensing electrode 230 is not limited, and the touch sensing electrode 230 may be in the same layer as the first electrode portion 131 and may also be in a different layer from the first electrode portion 131. The touch sensing electrode 230 may adopt a metal, a transparent conductive material or other applicable materials.

The protective layer 140 is formed on the touch shift register circuit 210, the touch scanning electrode 130 and the touch sensing electrode 230, and has main functions of protection and insulation. A material of the protective layer 140 is not limited, and may be an inorganic insulating material such as a silicon oxide and a silicon nitride, or an organic insulating material such as resin, or other applicable materials.

In this embodiment, the touch driver 003, for example, may be electrically connected to the touch shift register circuit 210 and the touch sensing electrode 230 of the touch panel by a flexible printed circuit board or the like.

The touch panel as shown in FIG. 5 may be combined with other products and structures, and for example, is attached to a display side of a liquid crystal display panel or an organic light-emitting diode (OLED) display panel, so as to form an on-cell touch display device. In such structure, the display panel, for example, may include an array substrate and an opposed substrate opposite to the array substrate, and the array substrate and the opposed substrate, for example, are combined with each other to form a space for accommodating a liquid crystal material or an OLED device. The touch structure, for example, is directly formed on the opposed substrate, and at the moment, the opposed substrate of the display panel is used as the base substrate for arranging the touch structure, and the touch structure and a display structure are formed on different sides of the base substrate. For example, the touch driver 003 may be integrally formed with a display controller, or formed by the display controller and the like.

Figure 6:
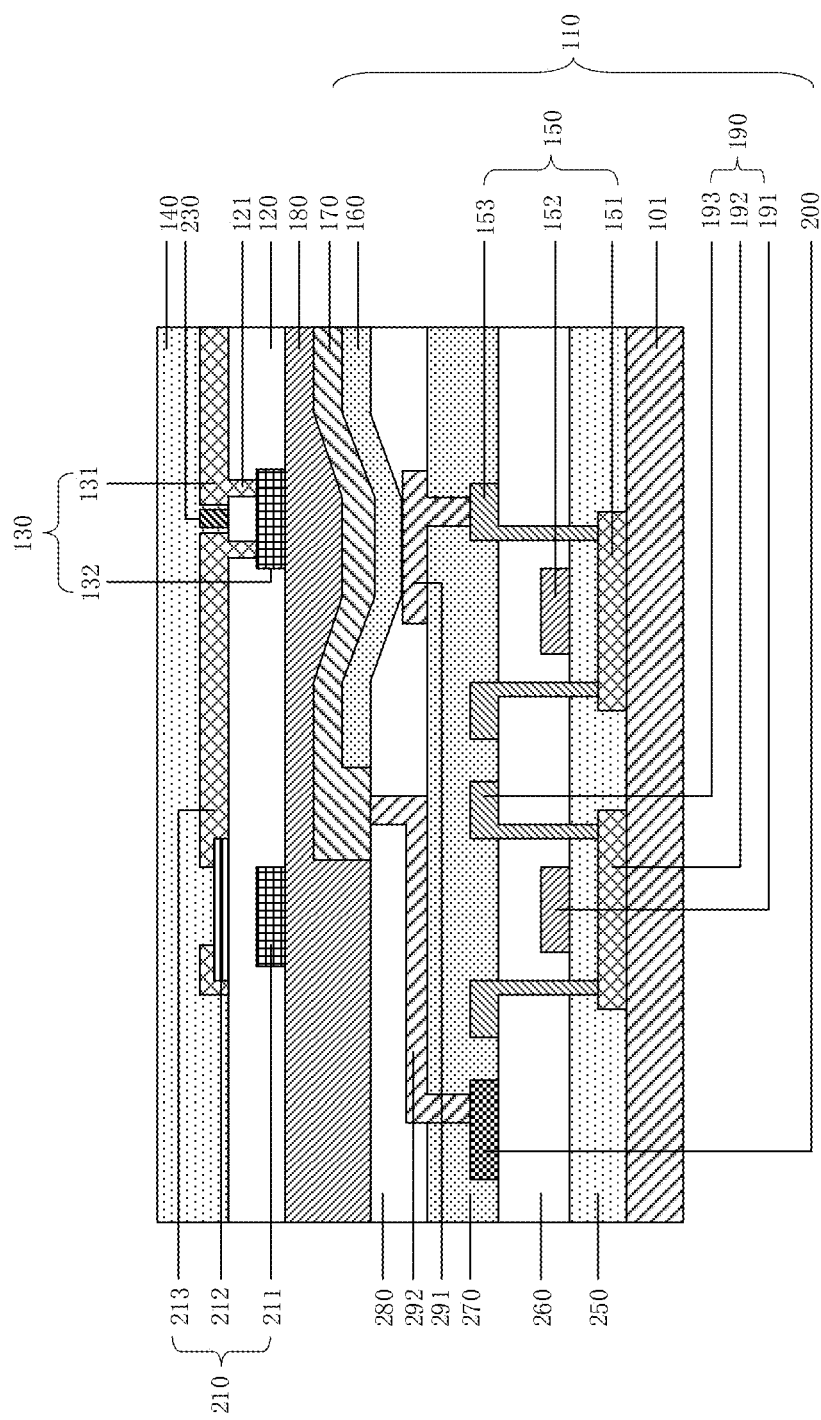
FIG. 6 is a sectional schematic diagram of another touch panel provided by an embodiment of the present disclosure.

FIG. 6 is a sectional schematic diagram of another touch panel provided by an embodiment of the present disclosure. With reference to FIG. 6, except that a display structure 110 and a thin film packaging layer 180 are further included, the touch panel provided by this embodiment is basically the same as that described in FIG. 5. In this embodiment, the display structure 110 and the touch structure, such as the touch scanning electrode 130 and the touch sensing electrode 230, are combined with each other, and thus, a touch display panel can be provided. The display structure 110, for example, includes a plurality of sub-pixel units arranged in an array, gate lines for providing display scanning signals for those sub-pixel units, data lines for providing data signals for those sub-pixel units, power lines (not shown in the drawing) for providing voltage signals for those sub-pixel units and the like, and for example, the display structure 110 includes an array substrate 101 and a pixel circuit 150, an electroluminescent layer 160, a cathode layer 170, a display shift register circuit 190, a common electrode line 200 and the like which are formed on the array substrate 101. For example, the electroluminescent layer 160 is an electroluminescent display array. For example, the common electrode line 200 is directly or indirectly arranged on the array substrate 101.

The pixel circuit 150 of the sub-pixel unit is used for driving and controlling the electroluminescent layer 160 to emit light, and may include a plurality of TFTs or field effect transistors or other devices (for example, capacitors), and may also adopt other applicable structural forms. For example, in an example, as shown in FIG. 6, the pixel circuit 150 includes a plurality of TFTs, and at least one TFT includes a gate electrode 152, an active layer 151 and a source electrode/drain electrode 153. For example, the source electrode/drain electrode 153 is electrically connected to the electroluminescent layer 160 through a first connecting electrode 291.

The display shift register circuit 190 is used for providing a plurality of display scanning and control signals and the like for the pixel circuits 150 of the sub-pixel units arranged in array, and for example, provides the display scanning signals in a progressive scanning mode, so that the sub-pixel units can be turned on row by row to carry out display. The display shift register circuit 190 may include a plurality of TFTs or field effect transistors or other devices with the same characteristics, and may also adopt other applicable structural forms. For example, in an example, as shown in FIG. 6, the display shift register circuit 190 includes a plurality of TFTs, and at least one TFT includes a gate electrode 191, an active layer 192 and a source electrode/drain electrode 193. For example, the source electrode/drain electrode 193 is electrically connected to the pixel circuit 150 through a scanning line (not shown in the drawing).

The common electrode line 200, for example, is electrically connected to the cathode layer 170 through a second connecting electrode 292, and is used for providing a common voltage signal (for example, a voltage signal VSS), and the common electrode line 200 may be made of a metal or other applicable materials. The electroluminescent layer 160 is arranged on the pixel circuit 150, and may include, but not limited to, an OLED, and for example, may include an anode, a cathode and an organic light-emitting layer sandwiched therebetween, and other structures or components of the touch panel in this embodiment can be correspondingly regulated. The cathode layer 170 is arranged on the electroluminescent layer 160 of the sub-pixel unit, and is used for providing a common cathode for the sub-pixel array. The cathode layer 170 may be made of a metal, a transparent conductive material or other applicable materials. The thin film packaging layer 180 is arranged on the display structure 110 and has main functions of protection and insulation. A material of the thin film packaging layer 180 is not limited, and may be an inorganic or organic thin film or other applicable materials. In this embodiment, the touch shift register circuit 210 and the touch structure are directly formed on the thin film packaging layer 180, i.e., the thin film packaging layer 180 not only carries out protection and insulation on the display structure 110, but also is used as the base substrate for the touch shift register circuit 210 and the touch structure so as to perform a supporting effect.

For example, the touch panel further includes a first insulating layer 250, a second insulating layer 260, a third insulating layer 270 and a pixel defining layer 280, the above-mentioned respective insulating layers and the pixel defining layer are arranged among respective film layers of the pixel circuit 150 and the display shift register circuit 190, and an arrangement mode of the insulating layers and the pixel defining layer can refer to FIG. 6, which is not repeated herein. It should be noted that in the embodiments of the present disclosure, the arrangement modes of the pixel circuit 150, the display shift register circuit 190, the common electrode line 200, and the above-mentioned respective insulating layers and the pixel defining layer are not limited to the case shown in FIG. 6, and may be any random applicable arrangement mode, for example, reference can be made to a conventional design, and details are not repeated herein. The TFTs in the pixel circuit 150 and the display shift register circuit 190 may be the top-gate type or bottom-gate type TFTs, which is not limited in the embodiments of the present disclosure.

The touch panel in this embodiment integrates components for achieving a touch function and components for achieving a display function, so that the touch panel not only has the touch function, but also has the display function, a structure of an existing display component is not influenced, influence on frame design can also be reduced, and the touch panel is beneficial for implementing touch and display driving integration and narrow frame design.

It should be noted that in each embodiment of the present disclosure, the display structure 110 is not limited to the above-mentioned structural form, and may be in a random structural form and also may include more or less components, which is not limited in the embodiments of the present disclosure.

Figure 7:
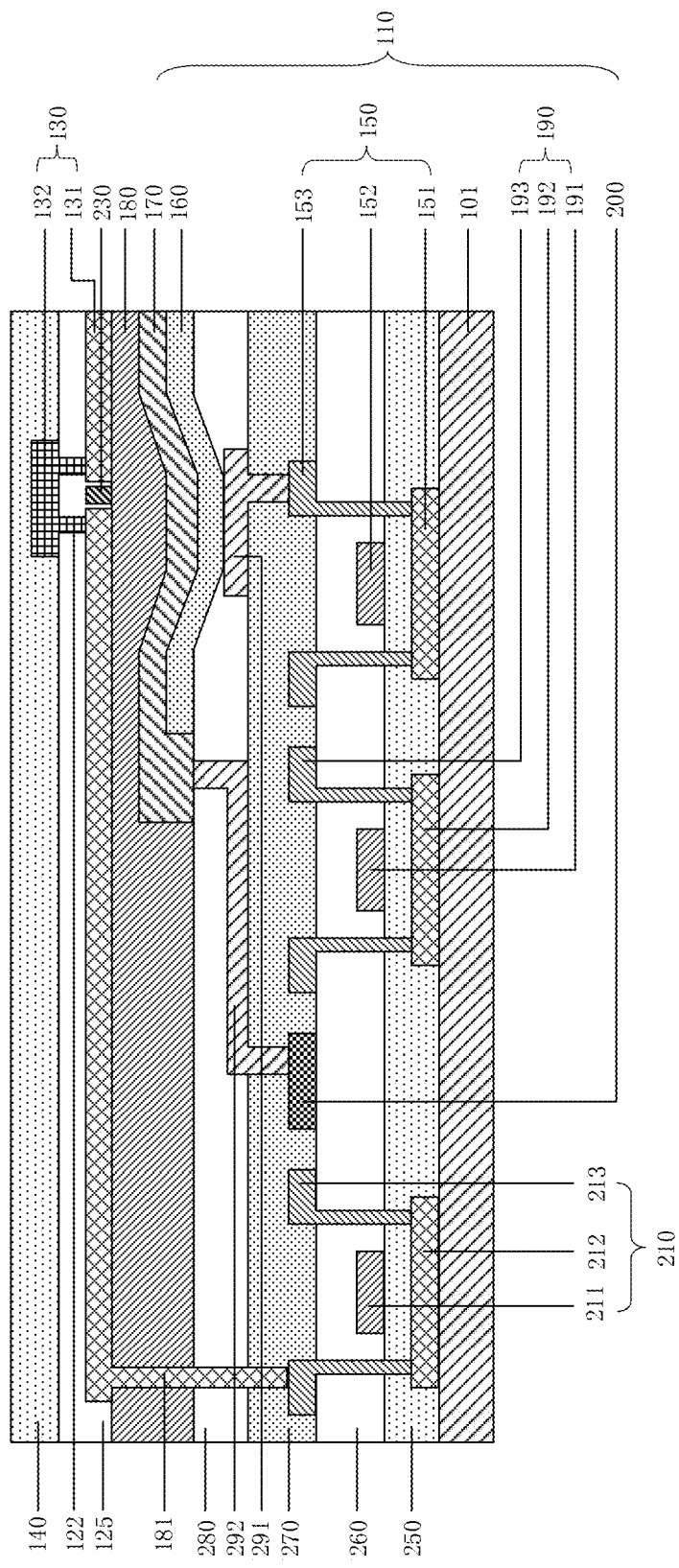
FIG. 7 is a sectional schematic diagram of yet another touch panel provided by an embodiment of the present disclosure.

FIG. 7 is a sectional schematic diagram of yet another touch panel provided by an embodiment of the present disclosure. With reference to FIG. 7, except an arrangement mode of the touch sensing electrode 230, the touch scanning electrode 130 and the touch shift register circuit 210, the touch panel in this embodiment can be basically the same as the touch panel described in FIG. 6. In this embodiment, the touch sensing electrode 230 is arranged on the thin film packaging layer 180. The touch scanning electrode 130 includes a first electrode portion 131 and a second electrode portion 132. The first electrode portion 131 is arranged on the thin film packaging layer 180 and is in the same layer as the touch sensing electrode 230. The second electrode portion 132 is arranged on an insulating layer 125. The insulating layer 125 has a second via hole 122. The first electrode portion 131 is electrically connected to the second electrode portion 132 through the second via hole 122. The second electrode portion 132 serves as a bridging portion so as to enable the touch scanning electrode 130 to pass over the touch sensing electrode 230 intersecting therewith.

In this embodiment, as shown in FIG. 7, the touch shift register circuit 210 is arranged on the array substrate 101 and for example, is at the same horizontal position as that where the display shift register circuit 190 is located, so that in this embodiment, the array substrate 101 is an example of the base substrate for the touch structure. For example, the touch shift register circuit 210 includes a plurality of TFTs, the display shift register circuit 190 also includes a plurality of TFTs. Each film layer of the TFTs in the touch shift register circuit 210 corresponds to each film layer of the TFTs in the display shift register circuit 190, and the corresponding film layers are in the same layers, i.e., the touch shift register circuit 210 and the display shift register circuit 190 are at the same horizontal position. The thin film packaging layer 180 has a third via hole 181. The touch shift register circuit 210 is electrically connected to the first electrode portion 131 through the third via hole 181, so that the touch scanning signal TXn can be output to the touch scanning electrode 130.

In this embodiment, the display structure 110 and the touch structure are arranged on a same side of the base substrate, and the touch structure is farther away from the base substrate than the display structure 110. The touch shift register circuit 210 is arranged on the array substrate 101 of the display structure 110, which can lower the requirement for a process temperature and is beneficial for improving performance of the touch shift register circuit 210; and the touch shift register circuit 210 can be manufactured simultaneously with the display shift register circuit 190 and the pixel circuit 150, so that process steps are reduced, and production cost is reduced. It should be noted that in each embodiment of the present disclosure, the arrangement position of the touch shift register circuit 210 on the array substrate 101 is not limited, and can be determined according to actual demands. The arrangement positions of the touch sensing electrode 230, the first electrode portion 131 and the second electrode portion 132 are not limited, and can be determined according to actual demands.

Figure 8:
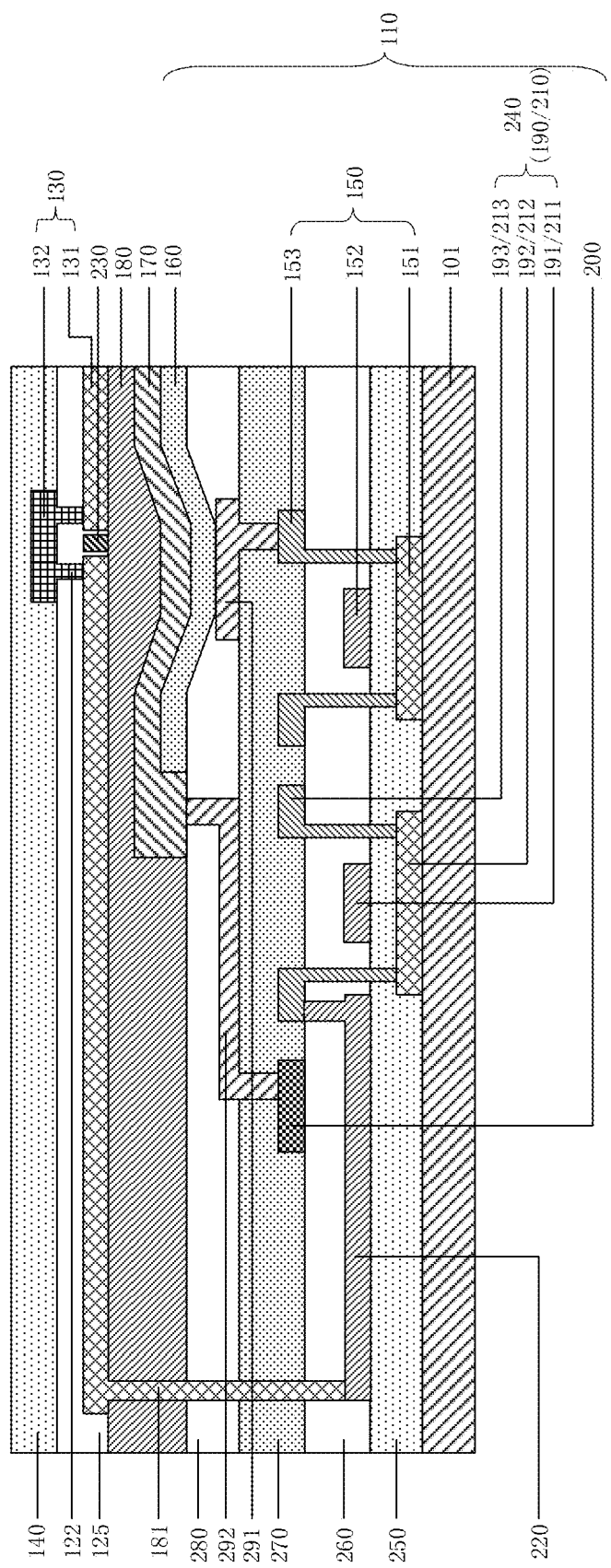
FIG. 8 is a sectional schematic diagram of still a further touch panel provided by an embodiment of the present disclosure.

FIG. 8 is a sectional schematic diagram of still a further touch panel provided by an embodiment of the present disclosure. With reference to FIG. 8, except the touch shift register circuit 210, the display shift register circuit 190, a touch scanning connecting line 220 and the common electrode line 200, the touch panel in this embodiment is basically the same as the touch panel described in FIG. 7. In this embodiment, the touch panel further includes a first shift register circuit 240. The first shift register circuit 240 is arranged on the array substrate 101, and includes the touch shift register circuit 210 and the display shift register circuit 190. The touch scanning connecting line 220 is arranged on the array substrate 101 (for example, arranged on the first insulating layer 250 on the array substrate 101), and is electrically connected to the touch shift register circuit 210 in the first shift register circuit 240. The touch scanning connecting line 220 may be made of a metal, a transparent conductive material or other applicable materials. It should be noted that there are a plurality of touch scanning connecting lines 220 and only one touch scanning connecting line 220 is shown in the drawing for concision. The common electrode line 200 is partially laminated on the touch scanning connecting line 220 and is insulated from the touch scanning connecting line 220 (for example, the common electrode line 200 is arranged on the second insulating layer 260). The thin film packaging layer 180 has the third via hole 181. The touch shift register circuit 210 in the first shift register circuit is electrically connected to the first electrode portion 131 of the touch scanning electrode 130 through the touch scanning connecting line 220 and the third via hole 181, and is used for outputting the touch scanning signal TXn to the touch scanning electrode 130. The display shift register circuit 190 in the first shift register circuit 240, for example, is electrically connected to the pixel circuit 150 by scanning lines (not shown in the drawing), and is used for providing a plurality of display scanning signals and the like for the pixel circuits 150 of the sub-pixel units arranged in array.

It should be noted that in the embodiments of the present disclosure, the first shift register circuit 240 may be merely a conventional shift register circuit, and the shift register circuit is not only used as the display shift register circuit 190, but also multiplexed as the touch shift register circuit 210, i.e., the display shift register circuit 190 is multiplexed as the touch shift register circuit 210. For example, a gate signal output by the display shift register circuit 190 is multiplexed as the touch scanning signal TXn output by the touch shift register circuit 210. In a signal multiplexing mode, the circuit structure can be simplified, and reliability can be improved. It should be noted that in each embodiment of the present disclosure, the number of the output signals of the display shift register circuit 190 is not limited, a type of the signal which can be multiplexed by the touch shift register circuit 210 is also not limited, and the random signal can be selected for multiplexing.

Figure 9:
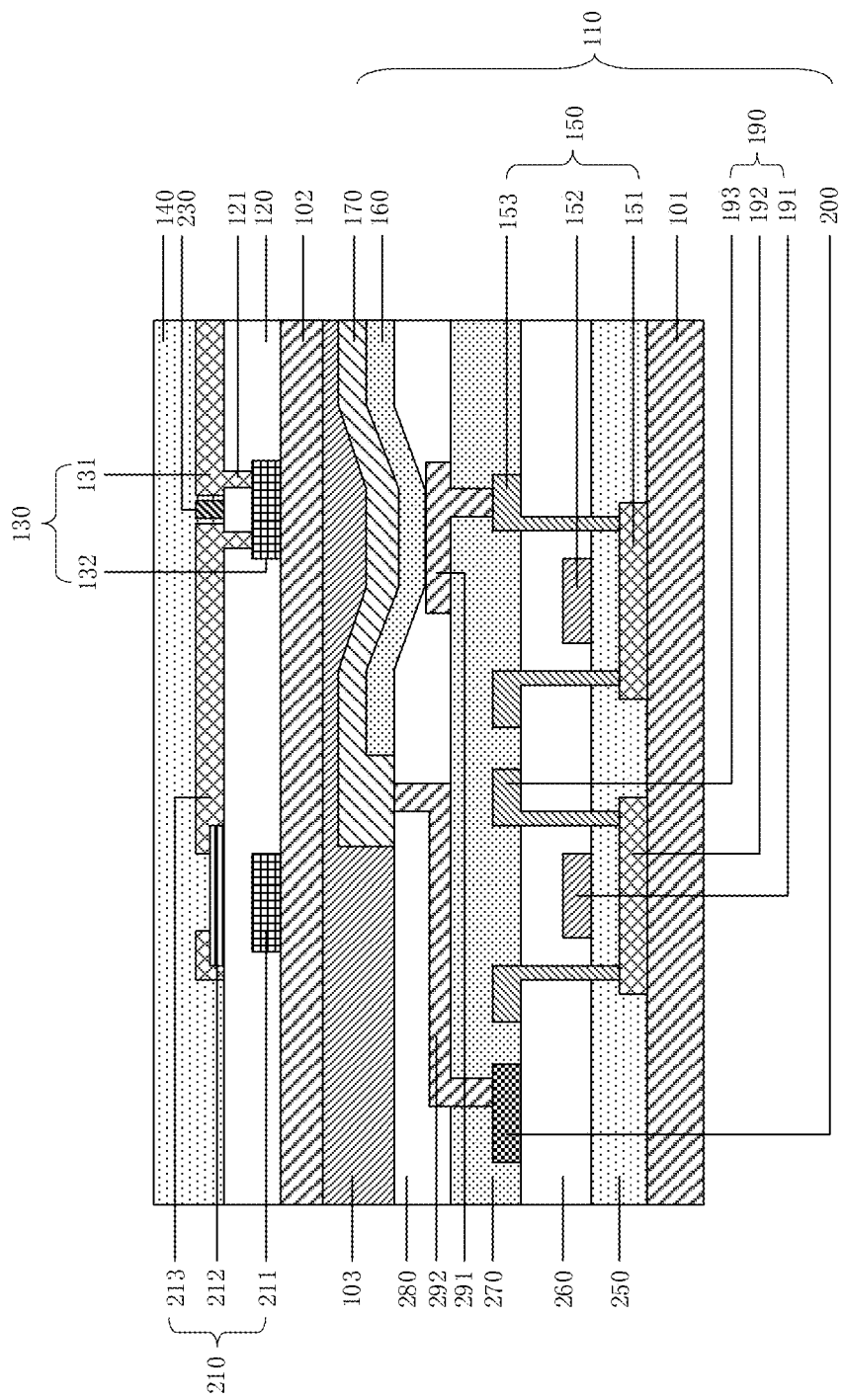
FIG. 9 is a sectional schematic diagram of an additional touch panel provided by an embodiment of the present disclosure.

FIG. 9 is a sectional schematic diagram of an additional touch panel provided by an embodiment of the present disclosure. With reference to FIG. 9, except a cover board 102, the touch panel in this embodiment is basically the same as the touch panel described in FIG. 6. In this embodiment, the display structure 110 includes the cover board 102. The cover board 102 is arranged on the cathode layer 170 and has main functions of protection, insulation and supporting. The cover board 102 may be made of glass, plastic, a ceramic material or other applicable materials. For example, the touch panel may further include a flat layer 103, the flat layer 103 covers the cathode layer 170, and the cover board 102 is arranged on the flat layer 103. The touch shift register circuit 210, the touch scanning electrode 130 and the touch sensing electrode 230 are arranged on the cover board 102, i.e., in this embodiment, the cover board 102 is an example of the base substrate, and the display structure 110 and the touch structure are arranged on different sides of the base substrate. The touch shift register circuit 210 is arranged on the cover board 102, which can lower the requirement for the process temperature, be beneficial for improving performance of the touch shift register circuit 210 and not influence an existing manufacturing process of the display structure.

Figure 10A:
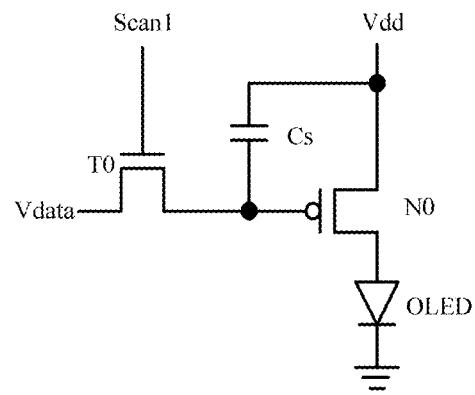
FIG. 10A is a structural diagram of a 2T1C pixel circuit of a touch panel provided by an embodiment of the present disclosure.
Figure 10B:
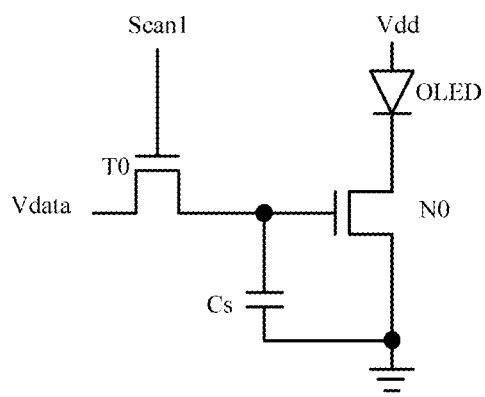
FIG. 10B is a structural diagram of a 2T1C pixel circuit of another touch panel provided by an embodiment of the present disclosure.

In the embodiments of the present disclosure, the display structure 110 may be an OLED panel, and a basic pixel circuit of each sub-pixel unit of the OLED panel generally is a 2T1C pixel circuit, i.e., two TFTs and one storage capacitor Cs are utilized to achieve a basic function of driving an OLED to emit light. FIG. 10A and FIG. 10B respectively are schematic diagrams of two types of 2T1C pixel circuits.

As shown in FIG. 10A, a 2T1C pixel circuit includes a switching transistor T0, a driving transistor N0 and a storage capacitor Cs. For example, a gate electrode of the switching transistor T0 is connected to a gate line (a scanning line) to receive a scanning signal Scant, for example, a source electrode is connected to a data line to receive a data signal Vdata, and a drain electrode is connected to a gate electrode of the driving transistor N0; a source electrode of the driving transistor N0 is connected to a first power supply end Vdd (for example, a high-voltage end), and a drain electrode is connected to an anode of an OLED; one end of the storage capacitor Cs is connected to the drain electrode of the switching transistor T0 and the gate electrode of the driving transistor N0, and the other end is connected to the source electrode of the driving transistor N0 and the first power supply end Vdd; and a cathode of the OLED is connected to a second power supply end Vss (for example, a low-voltage end), and for example, is grounded. A driving mode of the 2T1C pixel circuit is that bright and dark (gray level) of a pixel are controlled by the two TFTs and the storage capacitor Cs. When the scanning signal Scant is applied by the gate line to turn on the switching transistor T0, a data driving circuit charges the storage capacitor Cs by a data voltage (the data signal Vdata) provided by the data line through the switching transistor T0, so as to store the data voltage in the storage capacitor Cs, and the stored data voltage controls the turn-on degree of the driving transistor N0 so as to control a magnitude of a current flowing through the driving transistor N0 to drive the OLED to emit light, i.e., this current determines the gray level of light emission of the pixel. In the 2T1C pixel circuit shown in FIG. 10A, the switching transistor T0 is an N-type transistor and the driving transistor N0 is a P-type transistor.

As shown in FIG. 10B, another 2T1C pixel circuit also includes a switching transistor T0, a driving transistor N0 and a storage capacitor Cs, but a connecting mode thereof is changed a little, and the driving transistor N0 is an N-type transistor. The pixel circuit in FIG. 10B, with respect to that in FIG. 10A, has the changes that: an anode of an OLED is connected to a first power supply end Vdd (for example, a high-voltage end), a cathode is connected to a drain electrode of the driving transistor N0, and a source electrode of the driving transistor N0 is connected to a second power supply end Vss (for example, a low-voltage end) and for example, is grounded. One end of the storage capacitor Cs is connected to a drain electrode of the switching transistor T0 and a gate electrode of the driving transistor N0, and the other end is connected to the source electrode of the driving transistor N0 and the second power supply end Vss. A working mode of the 2T1C pixel circuit is basically the same as that of the pixel circuit as shown in FIG. 10A, and is not repeated herein.

In addition, for the pixel circuits shown in FIG. 10A and FIG. 10B, the switching transistor T0 is not limited to the N-type transistor, and may also be the P-type transistor, as long as the polarity of the scanning signal Scan1 for controlling turn-on or turn-off of the switching transistor is correspondingly changed.

The pixel circuit, on the basis of the above-mentioned 2T1C basic pixel circuits, may further include other circuit structures with a compensation function. The compensation function can be achieved by voltage compensation, current compensation or hybrid compensation, and the pixel circuit with the compensation function, for example, may be of a structure of 4T1C or 4T2C or the like. For example, in the pixel circuit with the compensation function, a data writing circuit and a compensation circuit are cooperated to write a voltage value carrying a data voltage and threshold voltage information of the driving transistor into a control electrode of the driving transistor and the voltage valve is stored by a voltage storage circuit. Specific examples of the compensation circuit are not described in detail herein.

At least one embodiment of the present disclosure further provides a touch device, and the touch device comprises the touch panel according to any one of the embodiments of the present disclosure. The touch device can shorten the lengths of the lead wires between the touch shift register circuit and the touch scanning electrodes and reduce the number of the lead wires between the touch driver and the touch panel, which thus can solve the problems of load increase caused by interference of the side signal to the lead wire and different loads caused by different lengths of the lead wires, improve detection accuracy, and lowers the requirement for the drive signals; and at least one embodiment in which the touch panel includes the display structure can attenuate influence on frame design and is beneficial for implementing touch and display driving integration and narrow frame design.

Figure 11:
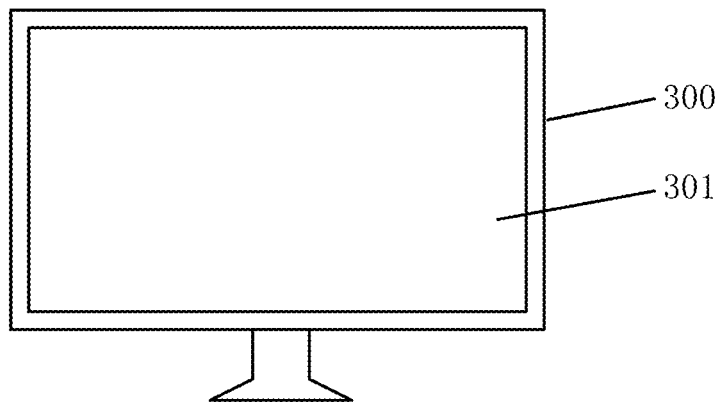
FIG. 11 is a schematic diagram of appearance of a touch device provided by an embodiment of the present disclosure.

FIG. 11 is a schematic diagram of appearance of a touch device provided by an embodiment of the present disclosure. With reference to FIG. 11, the touch device is a television 300. The television 300 includes a touch panel 301. The touch panel 301 is the touch panel with the display structure, as provided by any one of the embodiments of the present disclosure. The touch panel 301 not only can display according to an image signal, but also can carry out a touch detection.

It should be noted that in each embodiment of the present disclosure, the touch device is not limited to the television 300, and may further be any products or components with a touch function, such as a mobile phone, a tablet personal computer, a notebook computer, an electronic book, a game machine, a display, a digital photo frame, a navigator and the like. An integrated position of the touch panel 301 is not limited, and the touch panel 301 can be integrated on the front side, the side surface or other applicable positions of the touch device.

At least one embodiment of the present disclosure further provides a method of manufacturing a touch panel, and the method includes: forming a touch shift register circuit and a touch structure on a base substrate. The touch structure comprises touch scanning electrodes and touch sensing electrodes, the touch scanning electrodes are arranged on the base substrate along a first direction, the touch sensing electrodes are arranged on the base substrate along a second direction, the first direction intersects with the second direction, and the touch shift register circuit is electrically connected to the touch scanning electrodes. By using the method, the touch panel according to any one of the embodiments as described above can be manufactured, which can solve problems of load increase caused by interference of the side signal to the lead wires and different loads caused by different lengths of the lead wires, improve detection accuracy, and lowers the requirement for the drive signals; and moreover, at least one embodiment including the display structure can further attenuate influence on frame design and is beneficial for implementing touch and display driving integration and narrow frame design.

By using the method, the manufacturing sequence of the touch shift register circuit and the touch structure is not limited. For example, in an example of an embodiment, firstly, the touch shift register circuit is manufactured on the base substrate, and then the touch structure is manufactured on the base substrate. For example, in an example of another embodiment, the touch shift register circuit and the touch structure can be simultaneously manufactured. It should be noted that in each embodiment of the present disclosure, the method of manufacturing the touch panel is not limited to the steps and the sequence described as the above, and may further include more steps, and the sequence among each step can be determined according to the actual demands. For example, the method of manufacturing the touch panel may further include a step of forming the display structure on the base substrate.

The foregoing embodiments merely are exemplary embodiments of the disclosure, and not intended to define the scope of the disclosure, and the scope of the disclosure is determined by the appended claims.

What is claimed is:

1. A touch panel, comprising:
   a base substrate;
   a touch structure, the touch structure comprising:
      touch scanning electrodes, arranged on the base substrate along a first direction; and
      touch sensing electrodes, arranged on the base substrate along a second direction, wherein the first direction intersects with the second direction; and
   a touch shift register circuit, arranged on the base substrate, electrically connected to the touch scanning electrodes and configured to provide touch scanning signals to the touch scanning electrodes,
   wherein each of the touch scanning electrodes comprises a plurality of first electrode portions and a plurality of second electrode portions,
   the first electrode portions and the touch sensing electrodes are in a same layer, and the second electrode portions are in a different layer from the same layer in which the first electrode portions and the touch sensing electrodes are and serve as bridging portions for connecting adjacent first electrode portions, so that the touch scanning electrodes pass over the touch sensing electrodes intersecting with the touch scanning electrodes,
   wherein the touch shift register circuit comprises at least one thin film transistor,
   a source electrode and a drain electrode of the thin film transistor are in a same layer as the first electrode portions of the touch scanning electrodes, and a gate electrode of the thin film transistor is in a same layer as the second electrode portions of the touch scanning electrodes.

2. The touch panel according to claim 1, wherein the first electrode portions are farther away from the base substrate than the second electrode portions.

3. The touch panel according to claim 1, further comprising a display structure,
   wherein the display structure and the touch structure are laminated in a direction perpendicular to a panel surface of the touch panel.

4. The touch panel according to claim 3, wherein the display structure and the touch structure are on a same side of the base substrate, and the touch structure is farther away from the base substrate than the display structure.

5. The touch panel according to claim 4, further comprising a thin film packaging layer,
   wherein the thin film packaging layer is on the display structure, the touch structure is on the thin film packaging layer, and the display structure is between the thin film packing layer and the base substrate.

6. The touch panel according to claim 3, further comprising a thin film packaging layer,
wherein the thin film packaging layer is on the display structure, the touch structure is on the thin film packaging layer, and the display structure is between the thin film packing layer and the base substrate.

7. The touch panel according to claim 6, wherein the touch shift register circuit is on the thin film packaging layer.

8. The touch panel according to claim 6, wherein the display structure comprises an array substrate, the array substrate serves as the base substrate, and the touch shift register circuit is on the array substrate.

9. The touch panel according to claim 8, wherein the thin film packaging layer comprises via holes, and the touch shift register circuit is covered by the thin film packaging layer and is electrically connected to the touch scanning electrodes through the via holes in the thin film packaging layer.

10. The touch panel according to claim 9, wherein the display structure further comprises a display shift register circuit, and the touch shift register circuit and the display shift register circuit are arranged side by side on the array substrate.

11. The touch panel according to claim 10, wherein the display structure further comprises a common electrode line, and the common electrode line is on the array substrate.

12. The touch panel according to claim 8, wherein the touch shift register circuit is further configured to function as a display shift register circuit,
touch scanning connecting lines are on the array substrate, the thin film packaging layer comprises via holes, and the touch shift register circuit is electrically connected to the touch scanning electrodes through the touch scanning connecting lines and the via holes in the thin film packaging layer.

13. The touch panel according to claim 3, wherein the display structure comprises a cover board, the cover board serves as the base substrate, and the display structure and the touch structure are on different sides of the cover board.

14. The touch panel according to claim 3, wherein the display structure comprises an electroluminescent display array.

15. A touch device, comprising the touch panel according to claim 1.

16. A method of manufacturing a touch panel, comprising:
forming a touch shift register circuit and a touch structure on a base substrate,
wherein forming the touch structure comprises: forming touch scanning electrodes and touch sensing electrodes on the base substrate,
wherein the touch scanning electrodes are arranged on the base substrate along a first direction, the touch sensing electrodes are arranged on the base substrate along a second direction, the first direction intersects with the second direction, and the touch shift register circuit is electrically connected to the touch scanning electrodes and configured to provide touch scanning signals to the touch scanning electrodes,
wherein each of the touch scanning electrodes comprises a plurality of first electrode portions and a plurality of second electrode portions,
the first electrode portions and the touch sensing electrodes are in a same layer, and the second electrode portions are in a different layer from the same layer in which the first electrode portions and the touch sensing electrodes are and serve as bridging portions for connecting adjacent first electrode portions, so that the touch scanning electrodes pass over the touch sensing electrodes intersecting with the touch scanning electrodes,
wherein the touch shift register circuit comprises at least one thin film transistor,
a source electrode and a drain electrode of the thin film transistor are in a same layer as the first electrode portions of the touch scanning electrodes, and a gate electrode of the thin film transistor is in a same layer as the second electrode portions of the touch scanning electrodes.

\* \* \* \* \*